(12) United States Patent
Hirota (10) Patent No.: US 9,773,833 B2
(45) Date of Patent: Sep. 26, 2017

(54) PHOTOELECTRIC CONVERSION APPARATUS AND CAMERA

(71) Applicant: CANON KABUSHIKI KAISHA, Tokyo (JP)

(72) Inventor: Katsunori Hirota, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/073,903

(22) Filed: Mar. 18, 2016

(65) Prior Publication Data

US 2016/0284758 A1 Sep. 29, 2016

(30) Foreign Application Priority Data

Mar. 27, 2015 (JP) ................. 2015-067463

(51) Int. Cl.
*H04N 5/335* (2011.01)
*H01L 31/062* (2012.01)
*H01L 27/146* (2006.01)

(52) U.S. Cl.
CPC .... *H01L 27/14643* (2013.01); *H01L 27/1463* (2013.01); *H01L 27/14621* (2013.01); *H01L 27/14627* (2013.01)

(58) Field of Classification Search
CPC ........... H01L 27/14643; H01L 27/1463; H01L 29/7869; H01L 29/24; H01L 29/792
See application file for complete search history.

(56) References Cited

U.S. PATENT DOCUMENTS

| 7,271,835 | B2 * | 9/2007 | Iizuka ............... H01L 27/14609 257/E27.132 |
| 7,579,637 | B2 | 8/2009 | Nam et al. |
| 7,605,415 | B2 | 10/2009 | Koizumi et al. |
| 7,943,975 | B2 | 5/2011 | Koizumi et al. |
| 8,102,443 | B2 * | 1/2012 | Tsunai ............. H01L 27/14812 250/208.1 |
| 8,157,754 | B2 * | 4/2012 | Weintraub ............. A61H 11/02 601/134 |

(Continued)

FOREIGN PATENT DOCUMENTS

| JP | 2006-024907 A | 1/2006 |
| JP | 2006-279048 A | 10/2006 |

(Continued)

*Primary Examiner* — Trung Diep
(74) *Attorney, Agent, or Firm* — Fitzpatrick, Cella, Harper & Scinto (57) ABSTRACT

A photoelectric conversion apparatus includes a charge accumulation region of a first conductivity type, a first semiconductor region of a second conductivity type, a second semiconductor region of the second conductivity type, and an element isolation. The first semiconductor region is arranged so as to extend downward from a portion between the charge accumulation region and the element isolation, and the second semiconductor region includes a portion arranged below the charge accumulation region, and impurity concentration distributions of the charge accumulation region, the first semiconductor region and the second semiconductor region in a depth direction respectively have peaks at depth Rp1, Rp2, and Rp3, and Rp1<Rp2<Rp3 is satisfied. Impurity concentration C1 of the first semiconductor region at Rp2 is higher than impurity concentration C2 of the second semiconductor region at Rp3.

20 Claims, 10 Drawing Sheets

(56) References Cited

U.S. PATENT DOCUMENTS

| | | |
|---|---|---|
| 8,207,561 B2 | 6/2012 | Koizumi et al. |
| 8,345,133 B2 * | 1/2013 | Matsuda ........... H01L 27/14621 348/280 |
| 8,592,874 B2 | 11/2013 | Mori et al. |
| 8,624,307 B2 | 1/2014 | Koizumi et al. |
| 8,652,864 B2 * | 2/2014 | Tatani ............... H01L 27/14643 257/E27.133 |
| 8,670,056 B2 | 3/2014 | Kono et al. |
| 9,472,590 B2 * | 10/2016 | Nakamura ........ H01L 27/14689 |
| 2005/0269604 A1 | 12/2005 | Koizumi et al. |
| 2006/0214249 A1 | 9/2006 | Nam et al. |
| 2011/0073923 A1 * | 3/2011 | Tatani ............... H01L 27/14603 257/291 |
| 2011/0127408 A1 * | 6/2011 | Yanagita ........... H01L 27/14603 250/208.1 |
| 2011/0284929 A1 | 11/2011 | Mori et al. |
| 2014/0346578 A1 | 11/2014 | Hirota |
| 2015/0333098 A1 | 11/2015 | Endo et al. |

FOREIGN PATENT DOCUMENTS

| | | |
|---|---|---|
| JP | 2006-310650 A | 11/2006 |
| JP | 2008-078302 A | 4/2008 |
| JP | 2008-182076 A | 8/2008 |
| JP | 2009-252782 A | 10/2009 |
| JP | 2010-258094 A | 11/2010 |

* cited by examiner

PHOTOELECTRIC CONVERSION APPARATUS AND CAMERA

BACKGROUND OF THE INVENTION

Field of the Invention

The present invention relates to a photoelectric conversion apparatus and a camera equipped with it.

Description of the Related Art

Japanese Patent Laid-Open No. 2009-252782 has described a solid-state image sensor having a structure which suppresses the influence of a dark current generated in an element isolation insulation layer. The solid-state image sensor includes a photoelectric conversion unit formed by a p-type well region and an n-type region, the element isolation insulation layer, the first p-type element isolation layer arranged between the element isolation insulation layer and the n-type region, and the second p-type element isolation layer arranged under the first p-type element isolation layer. The first p-type element isolation layer and the second p-type element isolation layer are provided so as to surround the photoelectric conversion unit.

A defect exists at the interface between an element isolation and a semiconductor substrate. If a dark current generated in the defect flows into the photoelectric conversion unit, this becomes noise. In the solid-state image sensor, this noise can be a cause of decreasing the S/N ratio of an image or generating a white spot in the image. The structure described in Japanese Patent Laid-Open No. 2009-252782 is advantageous in reducing noise as described above. However, a further reduction in noise is required.

SUMMARY OF THE INVENTION

The present invention provides a photoelectric conversion apparatus having a structure advantageous in reducing the flow of charges to be a cause of noise from the vicinity of an element isolation into a charge accumulation region.

The first aspect of the present invention provides a photoelectric conversion apparatus comprising: a charge accumulation region of a first conductivity type, the charge accumulation region being arranged in the semiconductor substrate; a first semiconductor region of a second conductivity type different from the first conductivity type, the first semiconductor region being arranged in the semiconductor substrate; a second semiconductor region of the second conductivity type, the second semiconductor region being arranged in the semiconductor substrate; and an element isolation made of an insulator, the element isolation being arranged on the semiconductor substrate, wherein the first semiconductor region is arranged so as to extend downward from a portion between the charge accumulation region and the element isolation, and the second semiconductor region includes a portion arranged below the charge accumulation region, and an impurity concentration distribution of the charge accumulation region in a depth direction of the semiconductor substrate has a peak at a depth $Rp1$, an impurity concentration distribution of the first semiconductor region in the depth direction has a peak at a depth $Rp2$, an impurity concentration distribution of the second semiconductor region in the depth direction has a peak at a depth $Rp3$, and $Rp1<Rp2<Rp3$ is satisfied, and $C1$ is an impurity concentration of the first semiconductor region at the depth $Rp2$ and $C2$ is an impurity concentration of the second semiconductor region at the depth $Rp3$, and $C1>C2$ is satisfied.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings.

Figure 1:
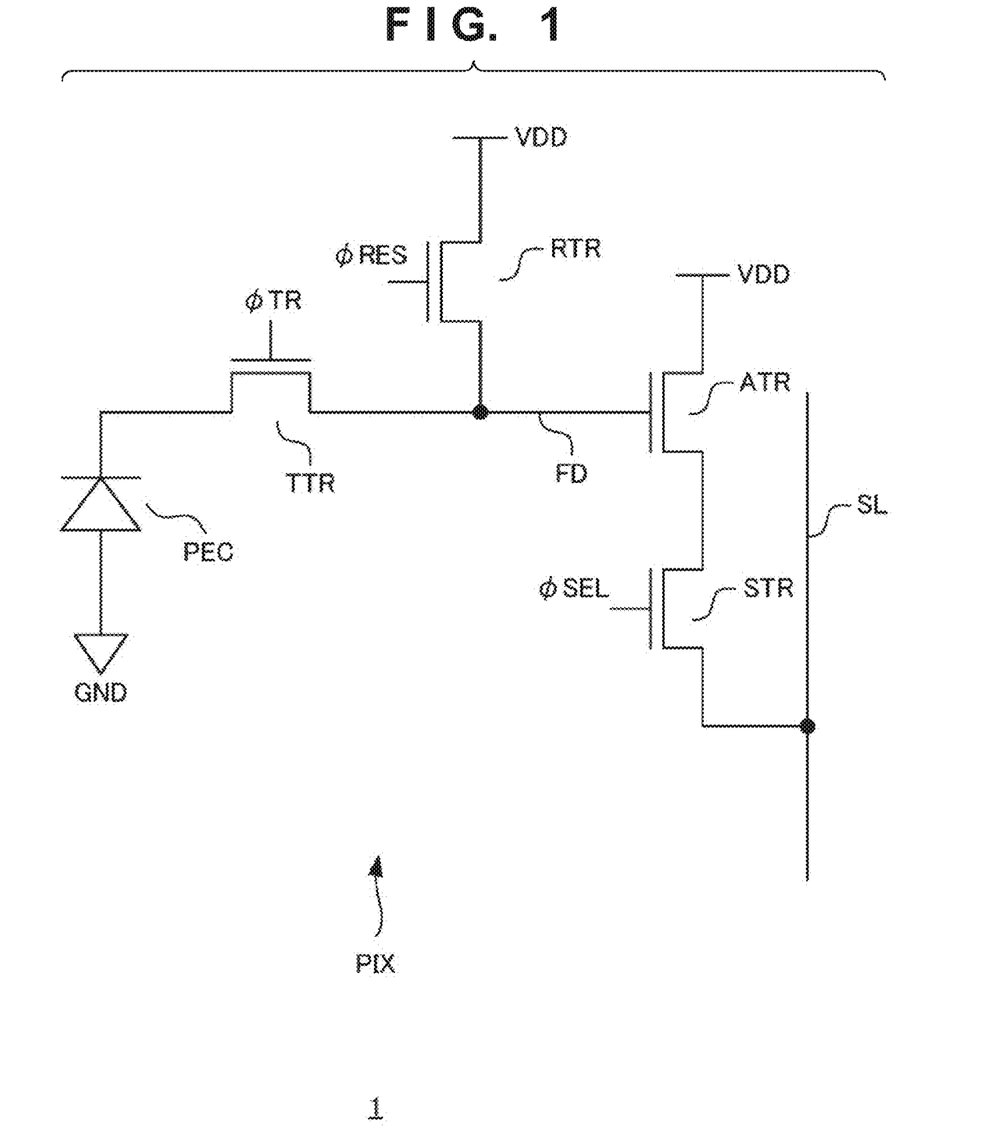
FIG. 1 is a circuit diagram showing an equivalent circuit as a part of a photoelectric conversion apparatus according to one embodiment of the present invention.

FIG. 1 shows an equivalent circuit as a part of a photoelectric conversion apparatus 1 according to one embodiment of the present invention. The photoelectric conversion apparatus 1 includes at least one pixel PIX. In one example, the photoelectric conversion apparatus 1 is configured as a solid-state image sensor (image sensor) having the plurality of pixels PIX arrayed so as to form a pixel array made of a plurality of rows and a plurality of columns. In another example, the photoelectric conversion apparatus 1 is configured as a line sensor having the plurality of pixels PIX arrayed in a line. In still another example, the photoelectric conversion apparatus 1 is configured as a photosensor including the single pixel PIX.

The pixel PIX includes a photoelectric conversion element PEC made of a photodiode or the like. The pixel PIX can include a floating diffusion FD which functions as a charge-voltage conversion unit configured to convert charges into a voltage, and a transfer transistor TTR which transfers charges generated and accumulated in the photoelectric conversion element PEC to the floating diffusion FD. When a transfer signal $\phi TR$ is activated, the transfer transistor TTR forms, between the photoelectric conversion element PEC and the floating diffusion FD, a channel for transferring the charges from the photoelectric conversion element PEC to the floating diffusion FD.

In addition, the pixel PIX can include at least one of a reset transistor RTR, an amplifier transistor ATR, and a selection transistor STR. When a reset signal ϕRES is activated, the reset transistor RTR resets the voltage of the floating diffusion FD. The amplifier transistor ATR outputs a voltage corresponding to the voltage of the floating diffusion FD to a signal line SL. In one example, a current source is connected to the signal line SL, and a source-follower circuit can be formed by the amplifier transistor ATR and the current source. When a selection signal ϕSEL is activated, the selection transistor STR can output a signal from the amplifier transistor ATR to the signal line SL.

When the photoelectric conversion apparatus 1 is configured as the solid-state image sensor, the photoelectric conversion apparatus 1 can further include a vertical selection circuit and a horizontal selection circuit configured to select the pixels in the pixel array, a readout circuit which reads out a signal from each pixel in the pixel array, and the like.

Figure 2:
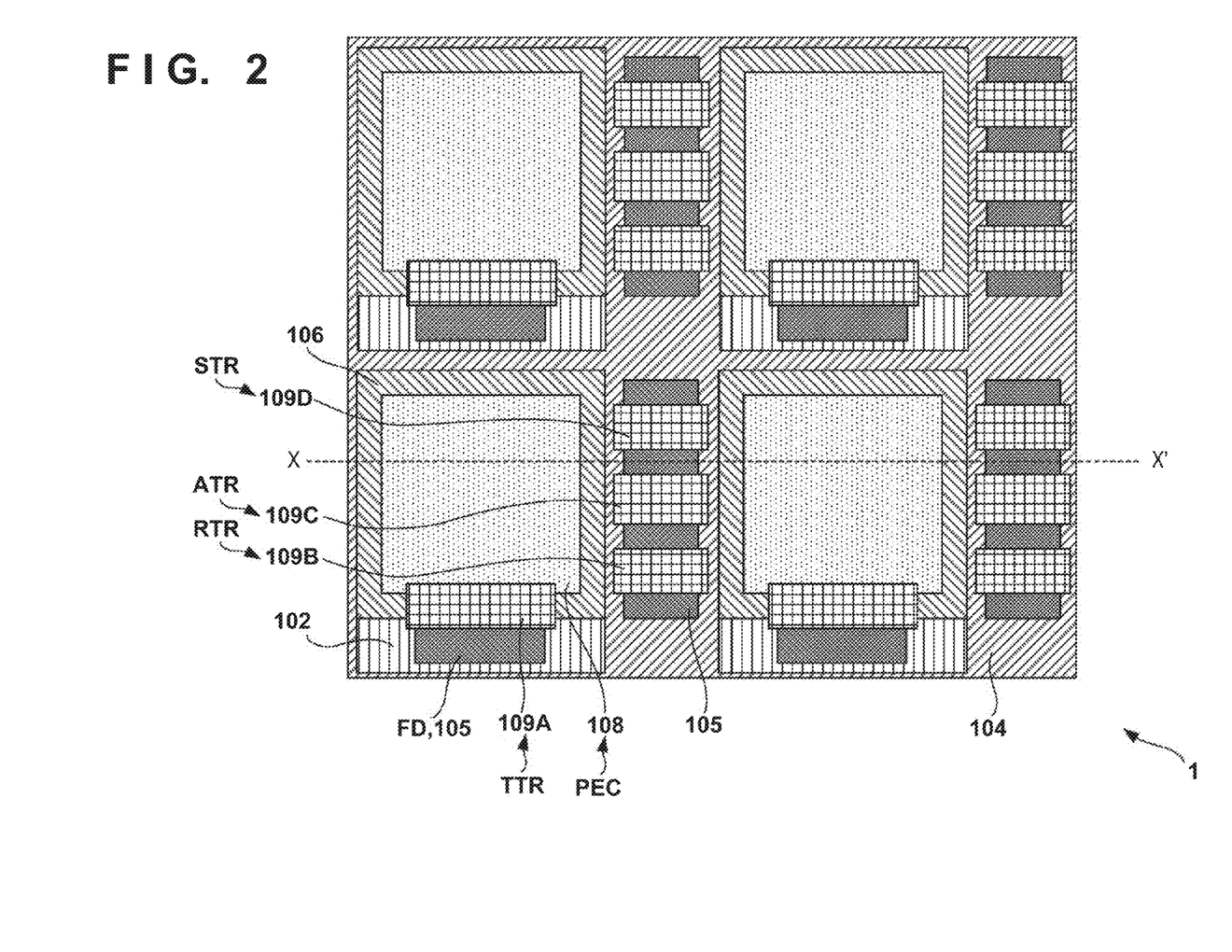
FIG. 2 is a view showing the two-dimensional layout of the photoelectric conversion apparatus according to the one embodiment of the present invention.
Figure 3:
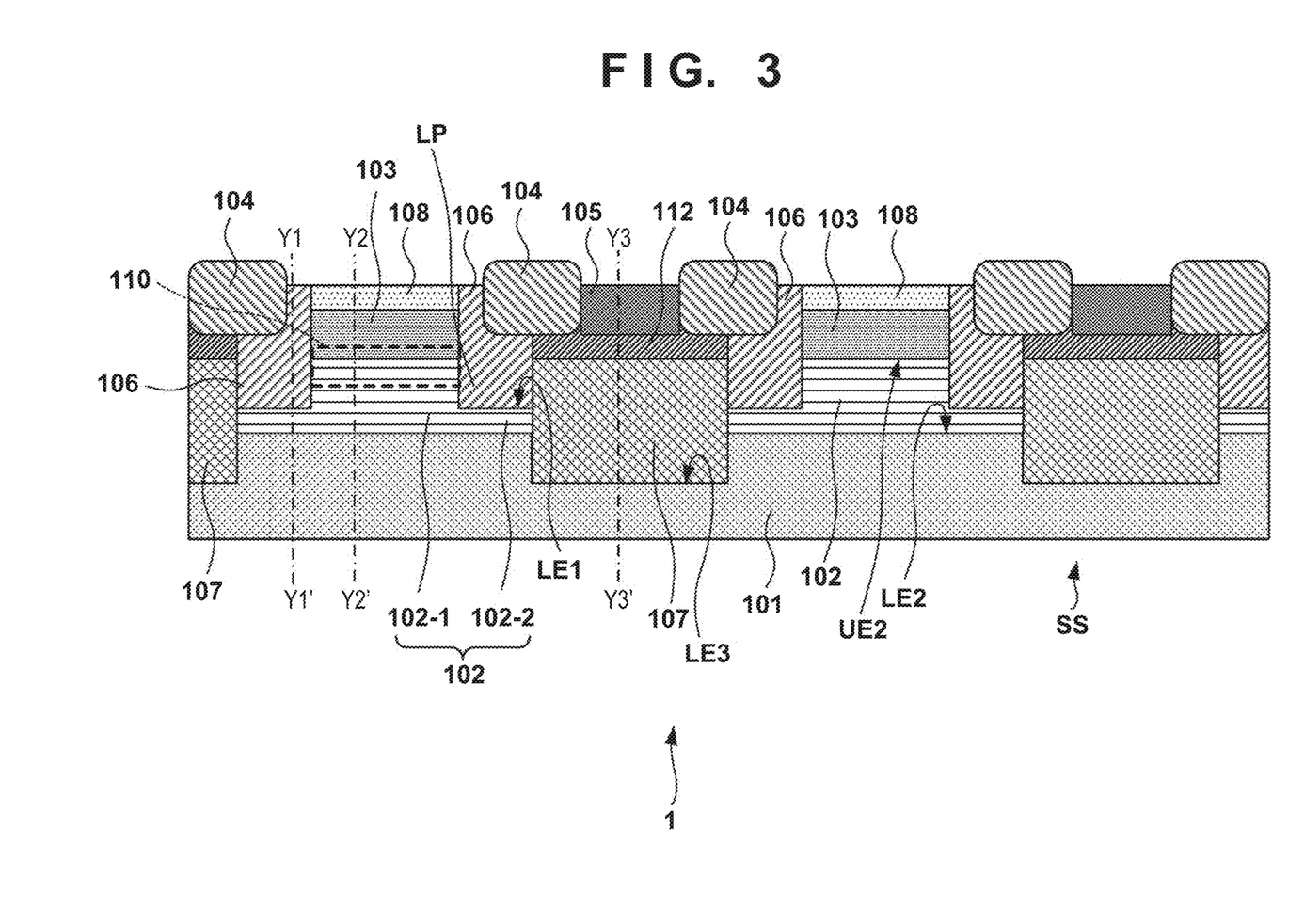
FIG. 3 is a sectional view showing the arrangement of the photoelectric conversion apparatus according to the first embodiment of the present invention.

FIG. 2 shows the two-dimensional layout of the photoelectric conversion apparatus 1. FIG. 3 is a sectional view showing the arrangement of the photoelectric conversion apparatus 1 according to the first embodiment of the present invention. Note that FIG. 3 is a sectional view taken along a line X-X' in FIG. 1. FIG. 2 shows the four pixels PIX. A structure above a gate electrode (for example, a contact plug, the first wiring layer, a via plug, the second wiring layer, a color filter, a microlens, and the like) is not shown in FIGS. 2 and 3.

The photoelectric conversion apparatus 1 includes a semiconductor substrate SS. A semiconductor region 101 of the first conductivity type, a charge accumulation region 103 of the first conductivity type, a first semiconductor region 106 of the second conductivity type, a second semiconductor region 102 of the second conductivity type, and an element isolation 104 made of an insulator are arranged on the semiconductor substrate SS. In addition, a third semiconductor region 107 of the second conductivity type, a fourth semiconductor region 112 of the second conductivity type, and a fifth semiconductor region 105 of the first conductivity type can be arranged in the semiconductor substrate SS. The semiconductor substrate SS is a structure made of a semiconductor material. In the example shown in FIG. 2, the semiconductor substrate SS includes the semiconductor region 101, the charge accumulation region 103, the first semiconductor region 106, the second semiconductor region 102, the third semiconductor region 107, the fourth semiconductor region 112, and the fifth semiconductor region 105. The first conductivity type and the second conductivity type are different from each other. For example, the second conductivity type is a p type when the first conductivity type is an n type and conversely, the second conductivity type is the n type when the first conductivity type is the p type.

The first semiconductor region 106 of the second conductivity type is arranged so as to extend downward from a portion between the charge accumulation region 103 of the first conductivity type and the element isolation 104. In other words, the first semiconductor region 106 includes the first portion arranged between the charge accumulation region 103 and the element isolation 104, and the second portion extending downward from the first portion. For example, the first semiconductor region 106 of the second conductivity type can be arranged so as to cover the side surface of the element isolation 104 on the side of the charge accumulation region 103 and at least a part of the bottom surface of the element isolation 104. Note that the first semiconductor region 106 may be arranged so as to cover the side surface of the element isolation 104 on the side of the charge accumulation region 103 and the entire bottom surface of the element isolation 104. Alternatively, the first semiconductor region 106 may be arranged so as to cover the side surface and the entire bottom surface of the element isolation 104.

The second semiconductor region 102 of the second conductivity type includes a first portion 102-1 arranged below the charge accumulation region 103 of the first conductivity type. The charge accumulation region 103 of the first conductivity type and the second semiconductor region 102 of the second conductivity type form the photodiode as the photoelectric conversion element PEC. The photoelectric conversion element PEC may further include a semiconductor region 108 of the second conductivity type arranged on the charge accumulation region 103 of the first conductivity type. The element isolation 104 can be, for example, an STI (Shallow Trench Isolation) or a LOCOS (Local Oxidation of Silicon).

The peak value of an impurity concentration in the first semiconductor region 106 is larger than that in the second semiconductor region 102. The charge accumulation region 103 of the first conductivity type and the second semiconductor region 102 of the second conductivity type form a pn junction. A depletion layer 110 is formed in the boundary portion between the charge accumulation region 103 of the first conductivity type and the second semiconductor region 102 of the second conductivity type. The first semiconductor region 106 can be arranged so as to surround the entirety of the charge accumulation region 103, a part of the second semiconductor region 102, and the semiconductor region 108 (if the semiconductor region 108 exists).

A lower end LE1 of the first semiconductor region 106 is preferably in a position deeper than an upper end UE2 of the second semiconductor region 102 and shallower than a lower end LE2 of the second semiconductor region 102. In this case, the second semiconductor region 102 includes a second portion 102-2 arranged below the lower end LE1 of the first semiconductor region 106. Charges serving as majority carriers of the first conductivity type out of positive and negative charges generated by photoelectric conversion in the second portion 102-2 (electrons when the first conductivity type is the n type or holes when the first conductivity type is the p type) move to and are accumulated in the charge accumulation region 103. It is therefore possible, by providing the second portion 102-2, to increase collection efficiency of the charges by the charge accumulation region 103.

The third semiconductor region 107 of the second conductivity type can be arranged in the lateral direction of the second semiconductor region 102 of the second conductivity type. A lower portion LP of the first semiconductor region 106 of the second conductivity type can be arranged between the third semiconductor region 107 of the second conductivity type and the first portion 102-1 of the second semiconductor region 102 of the second conductivity type. The peak value of an impurity concentration in the third semiconductor region 107 is preferably larger than that in the second semiconductor region 102. A lower end LE3 of the third semiconductor region 107 is preferably in a position deeper than the lower end LE2 of the second semiconductor region 102. Such an arrangement is advantageous in suppressing color mixture and blooming caused when the charges move between the pixel PIX and the pixel PIX or increasing collection efficiency of the charges in the charge accumulation region 103.

The diffusion regions (the source region and the drain region) of the transistors ATR, RTR, and STR can be formed by arranging the fourth semiconductor region 112 on the third semiconductor region 107 and arranging the fifth semiconductor region 105 on the fourth semiconductor region 112.

Figure 4:
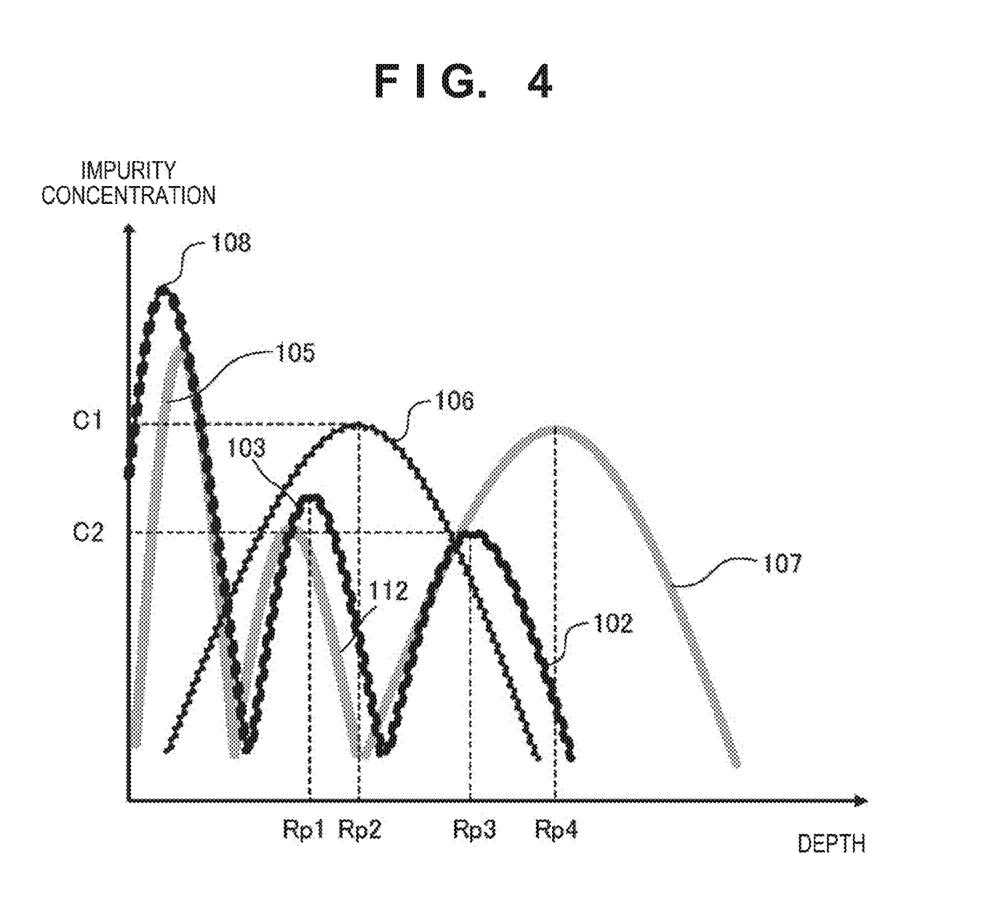
FIG. 4 is a graph showing impurity concentration distributions in the photoelectric conversion apparatus according to the first embodiment of the present invention.

FIG. 4 shows impurity concentration distributions in the first semiconductor region 106 of the second conductivity type and the second semiconductor region 102 of the second conductivity type taken along Y1-Y1' in FIG. 3. FIG. 4 also shows impurity concentration distributions in the semiconductor region 108 of the second conductivity type, the charge accumulation region 103 of the first conductivity type, and the second semiconductor region 102 of the second conductivity type taken along Y2-Y2' in FIG. 3. FIG. 4 further shows impurity concentration distributions in the fifth semiconductor region 105 of the first conductivity type, the fourth semiconductor region 112 of the second conductivity type, and the third semiconductor region 107 of the second conductivity type taken along Y3-Y3' in FIG. 3. In FIG. 4, the abscissa indicates the depth of the semiconductor substrate SS and the ordinate indicates the impurity concentration. Note that the impurity concentration means the net impurity concentration for forming the semiconductor region of the first conductivity type in the case of the semiconductor region of the first conductivity type or means the net impurity concentration for forming the semiconductor region of the second conductivity type in the case of the semiconductor region of the second conductivity type.

The impurity concentration distribution of the charge accumulation region 103 in the depth direction of the semiconductor substrate SS has a peak at a depth Rp1. The impurity concentration distribution of the first semiconductor region 106 in the depth direction has a peak at a depth Rp2. The impurity concentration (that is, the peak value) of the first semiconductor region 106 at the depth Rp2 is C1. The impurity concentration distribution of the second semiconductor region 102 in the depth direction has a peak at a depth Rp3. The impurity concentration (that is, the peak value) of the second semiconductor region 102 at the depth Rp3 is C2.

Note that as exemplified in FIG. 4, it is preferable that Rp1<Rp2<Rp3 is satisfied and C1>C2 is satisfied. According to this arrangement, the first semiconductor region 106 forms a potential barrier so as to surround the boundary portion between the charge accumulation region 103 of the first conductivity type and the second semiconductor region 102 of the second conductivity type, that is, a region where the depletion layer 110 is formed. Such a structure is advantageous in reducing the flow of charges to be a cause of noise from the vicinity of the element isolation 104 (the interface between the element isolation 104 and the semiconductor regions 106, 112, and 105) into the charge accumulation region 103 or the depletion layer 110. Such a structure is also advantageous in controlling a potential gradient formed by the charge accumulation region 103, the first semiconductor region 106, and the second semiconductor region 102 so as to increase collection efficiency of the charges by the charge accumulation region 103.

It is preferable that the impurity concentration distribution of the third semiconductor region 107 in the depth direction of the semiconductor substrate SS has a peak at a depth Rp4 and Rp1<Rp2<Rp3<Rp4 is satisfied. The third semiconductor region 107 forms a potential barrier between the pixel PIX and the pixel PIX. The third semiconductor region 107 is advantageous in suppressing color mixture and blooming caused when the charges move between the pixel PIX and the pixel PIX, and increasing collection efficiency of the charges by the charge accumulation region 103.

A method of manufacturing the photoelectric conversion apparatus 1 will exemplarily be described below with reference to FIGS. 5 to 8. In order to provide a more practical example, a description will be given below assuming that the first conductivity type is the n type and the second conductivity type is the p type. On the contrary, however, the first conductivity type may be the p type and the second conductivity type may be the n type.

Figure 5:
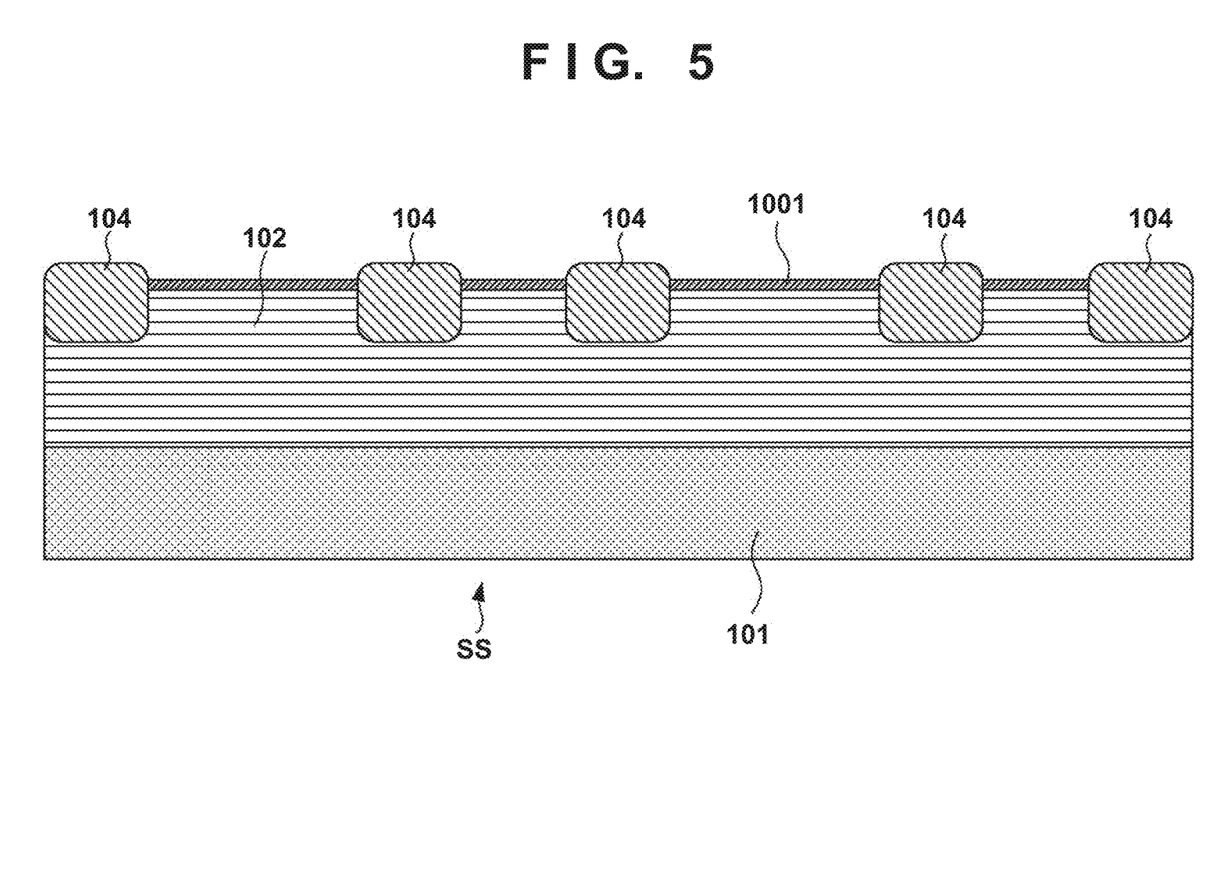
FIG. 5 is a view showing a method of manufacturing the photoelectric conversion apparatus according to the one embodiment of the present invention.

First, in a step shown in FIG. 5, the semiconductor substrate SS including the semiconductor region 101 of the first conductivity type (here, the n type) is prepared and the element isolation 104 is formed in the semiconductor substrate SS. The semiconductor substrate SS including the semiconductor region 101 may be the semiconductor region 101 as a whole, a semiconductor substrate including the semiconductor region 101 of the first conductivity type on the semiconductor region of the first conductivity type or the second conductivity type, or a semiconductor substrate having another structure. The element isolation 104 can have a thickness falling within a range of, for example, 200 nm to 300 nm.

In addition, in the step shown in FIG. 5, a sacrificial oxide film 1001 is formed in a region other than a region formed in the element isolation 104, that is, an element region. The sacrificial oxide film 1001 can have a thickness falling within a range of, for example, 10 nm to 20 nm. The photoelectric conversion element PEC, the floating diffusion FD, and the transistors ATR, RTR, and STR are formed in the element region. Then, an impurity such as boron ions (B+) for forming the semiconductor region of the second conductivity type (here, the p type) is implanted into the semiconductor substrate SS on conditions that an acceleration voltage is 150 to 300 KeV and a dose is $1.0 \times 10^{12}$ cm$^{-2}$ to $5.0 \times 10^{12}$ cm$^{-2}$. As a result, the second semiconductor region 102 of the second conductivity type is formed. Implementation for forming the second semiconductor region 102 may be executed a plurality of times with the acceleration voltages and/or the doses different from each other.

Figure 6:
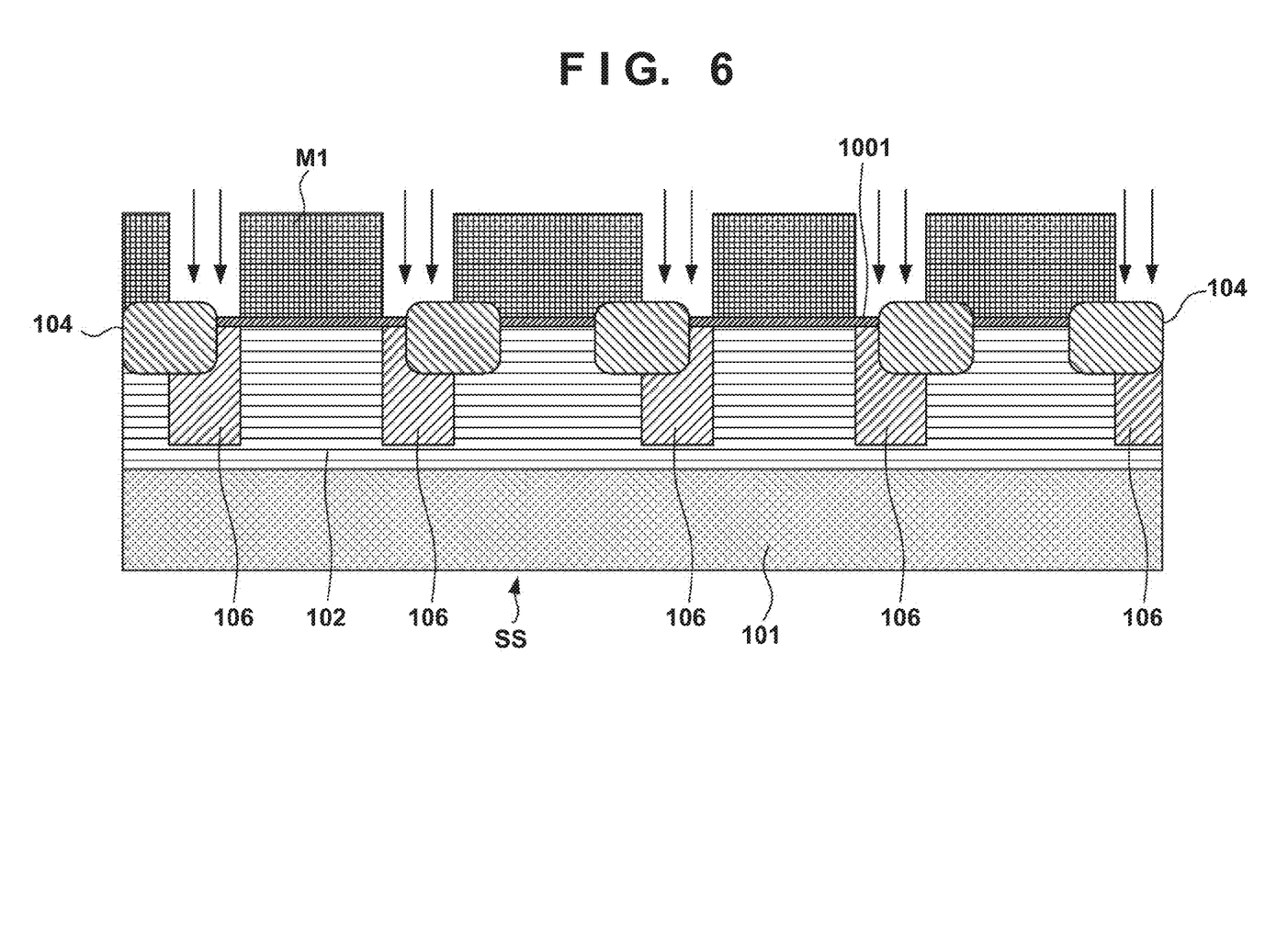
FIG. 6 is a view showing the method of manufacturing the photoelectric conversion apparatus according to the one embodiment of the present invention.

Next, in a step shown in FIG. 6, a mask M1 is first formed on the surface of the semiconductor substrate SS. For example, the mask M1 can be a mask made of a resin such as a photoresist but may be a hard mask. Then, the impurity such as the boron ions (B+) for forming the semiconductor region of the second conductivity type on a condition that it penetrates the element isolation 104 is implanted into the semiconductor substrate SS on conditions that the acceleration voltage is 50 to 150 KeV and the dose is $5.0 \times 10^{12}$ cm$^{-2}$ to $1.0 \times 10^{13}$ cm$^{-2}$. As a result, the first semiconductor region 106 of the second conductivity type is formed. Then, the mask M1 is removed. Implementation for forming the first semiconductor region 106 may be executed the plurality of times with the acceleration voltages and/or the doses different from each other.

When implanting the impurity for forming the first semiconductor region 106 of the second conductivity type, an isolation region which divides the charge accumulation region 103 of the first conductivity type into a plurality of portions may be formed together with the first semiconductor region 106. The divided charge accumulation region 103 can be used, for example, to detect a phase difference for auto focus. Also, for example, the pn junction is formed in the central portion of the charge accumulation region 103 of the first conductivity type by forming the semiconductor region of the second conductivity type in the central portion. This can contribute to a decrease in a depletion voltage and facilitation of charge transfer from the charge accumulation region 103 to the floating diffusion FD.

Figure 7:
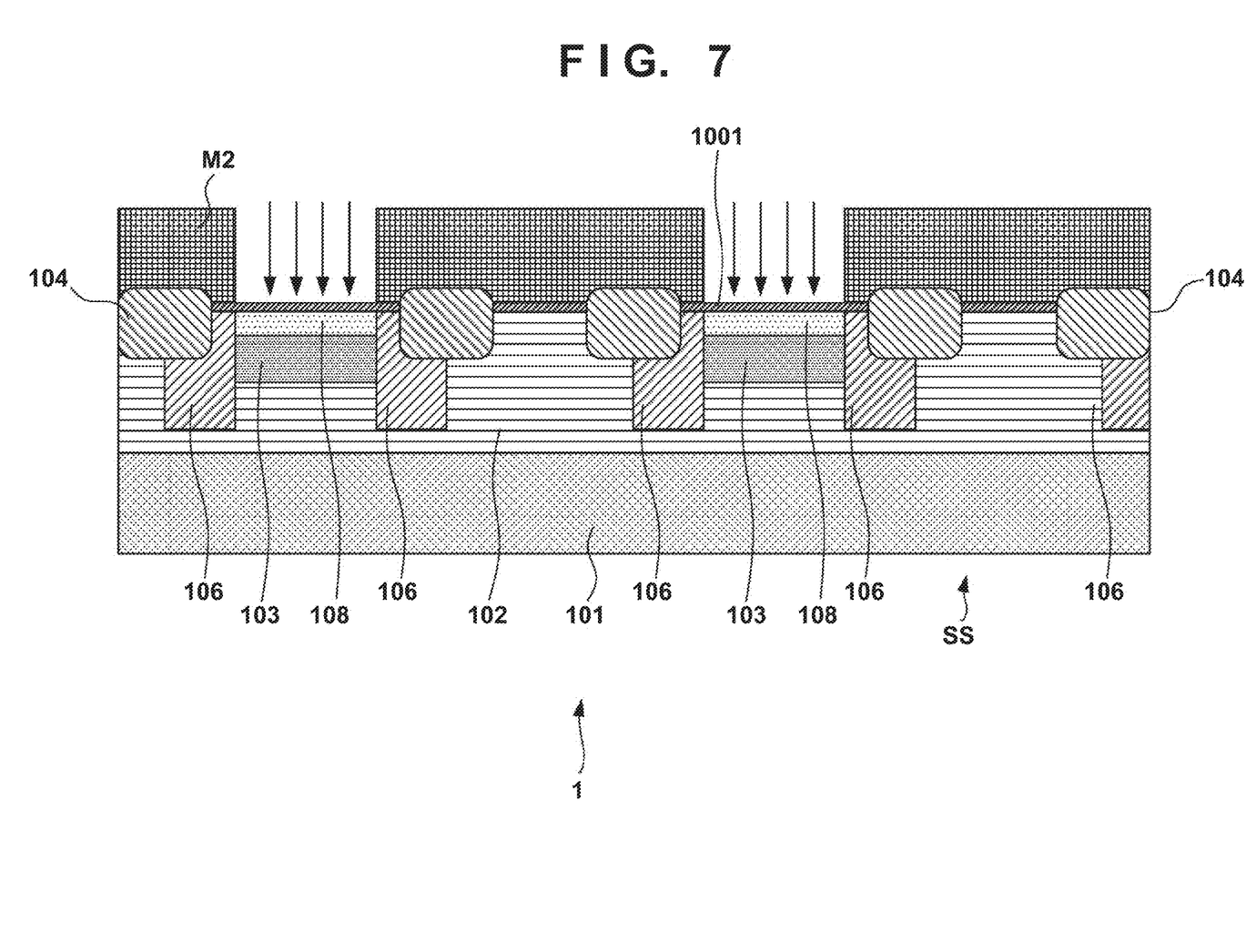
FIG. 7 is a view showing the method of manufacturing the photoelectric conversion apparatus according to the one embodiment of the present invention.

Then, in a step shown in FIG. 7, a mask M2 is first formed on the surface of the semiconductor substrate SS. For example, the mask M2 can be a mask made of the resin such as the photoresist but may be a hard mask. Then, the impurity such as the boron ions (B+) for forming the semiconductor region of the second conductivity type (here, the p type) is implanted into the semiconductor substrate SS on conditions that the acceleration voltage is 10 to 20 KeV and the dose is $5.0 \times 10^{13}$ cm$^{-2}$ to $1.0 \times 10^{14}$ cm$^{-2}$. As a result, the semiconductor region 108 of the second conductivity type is formed. Further, an impurity such as arsenic ions (As+) for forming the semiconductor region of the first conductivity type (here, the n type) is implanted into the semiconductor substrate SS on conditions that the acceleration voltage is 300 to 500 KeV and the dose is $1.0 \times 10^{12}$ cm$^{-2}$ to $5.0 \times 10^{12}$ cm$^{-2}$. As a result, the charge accumulation region 103 of the first conductivity type is formed. The semiconductor region 108 of the second conductivity type and the charge accumulation region 103 of the first conductivity type may be formed in a reverse order.

Figure 8:
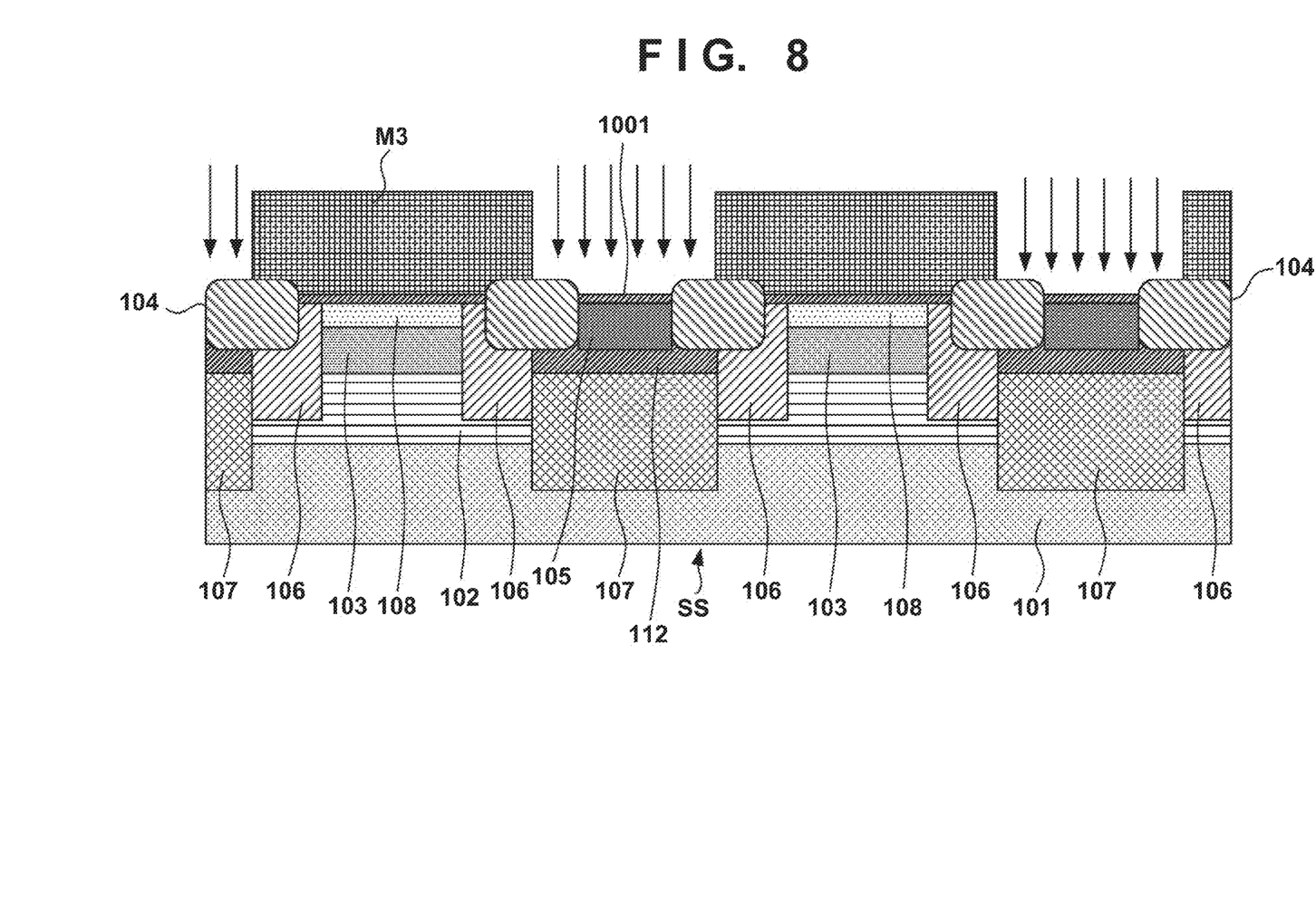
FIG. 8 is a view showing the method of manufacturing the photoelectric conversion apparatus according to the one embodiment of the present invention.

Then, in a step shown in FIG. 8, a mask M3 is first formed on the surface of the semiconductor substrate SS. For example, the mask M3 can be a mask made of the resin such as the photoresist but may be a hard mask. Then, the third semiconductor region 107 of the second conductivity type, the fourth semiconductor region 112 of the second conductivity type, and the fifth semiconductor region 105 of the first conductivity type are formed by implanting the impurities into the semiconductor substrate SS.

Figure 9:
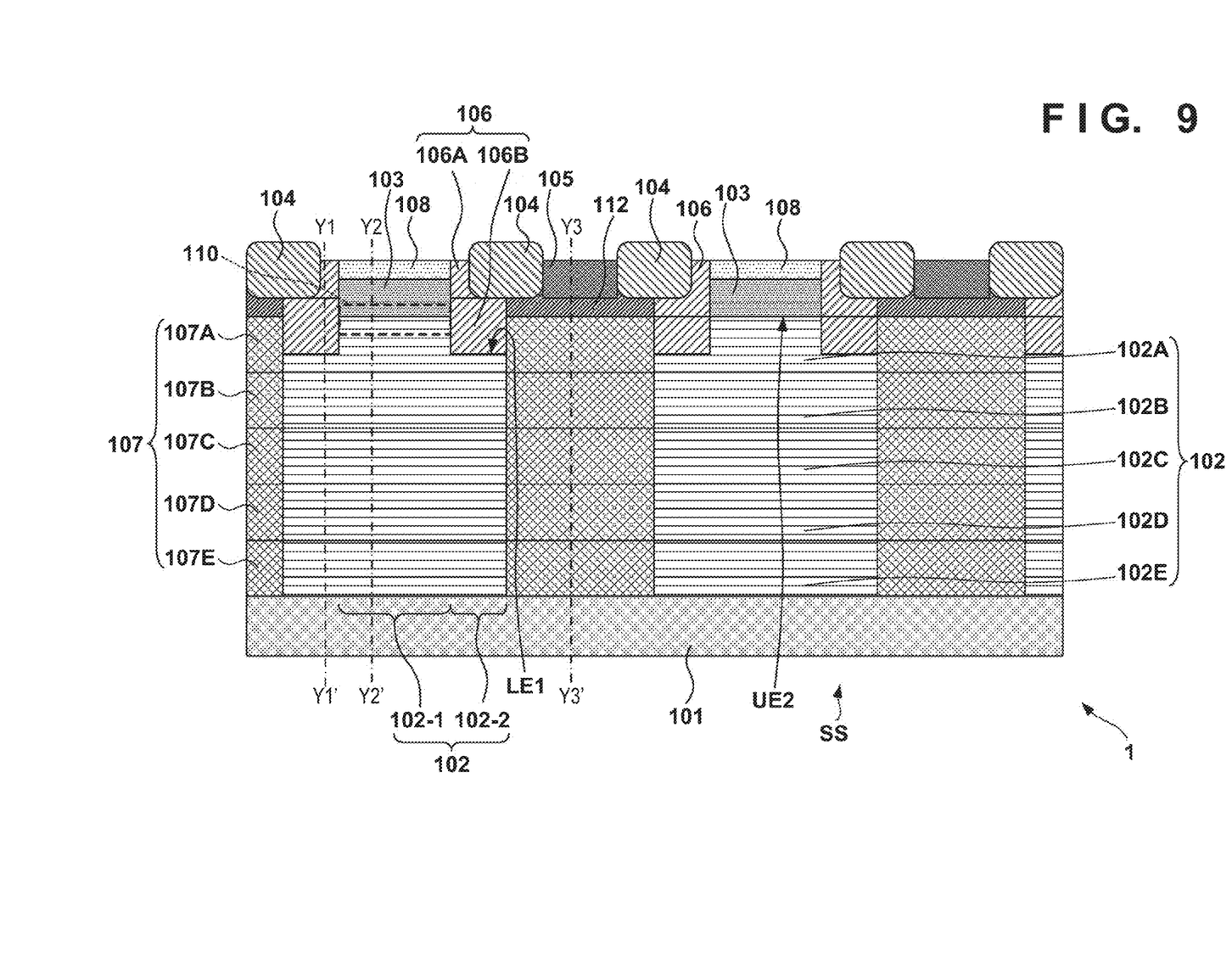
FIG. 9 is a sectional view showing the arrangement of a photoelectric conversion apparatus according to the second embodiment of the present invention.
Figure 10:
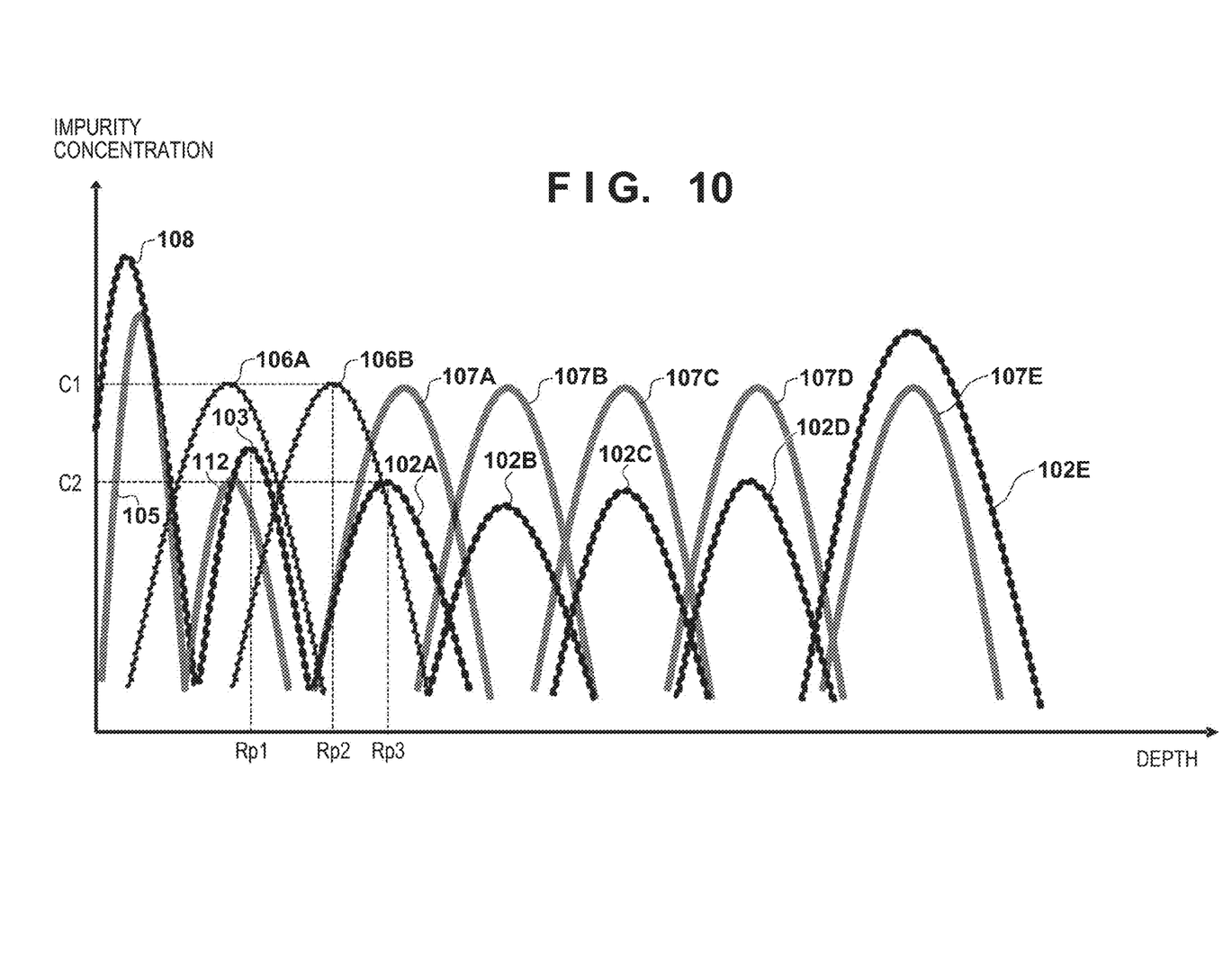
FIG. 10 is a graph showing impurity concentration distributions in the photoelectric conversion apparatus according to the second embodiment of the present invention.

A photoelectric conversion apparatus 1 according to the second embodiment of the present invention will be described below with reference to FIGS. 9 and 10. Matters that are not mentioned in the second embodiment can comply with the first embodiment. FIG. 9 is a sectional view taken along a line X-X' in FIG. 1. FIG. 10 shows impurity concentration distributions of a first semiconductor region 106 of the second conductivity type and a second semiconductor region 102 of the second conductivity type taken along Y1-Y1' in FIG. 9. FIG. 10 also shows impurity concentration distributions in a semiconductor region 108 of the second conductivity type, a charge accumulation region 103 of the first conductivity type, and the second semiconductor region 102 of the second conductivity type taken along Y2-Y2' in FIG. 9. FIG. 10 further shows impurity concentration distributions in a fifth semiconductor region 105 of the first conductivity type, a fourth semiconductor region 112 of the second conductivity type, and a third semiconductor region 107 of the second conductivity type taken along Y3-Y3' in FIG. 9.

In the second embodiment, at least one of the first semiconductor region 106 of the second conductivity type, the second semiconductor region 102 of the second conductivity type, and the third semiconductor region 107 of the second conductivity type includes a plurality of regions of the second conductivity type stacked in the depth direction of a semiconductor substrate SS. The first semiconductor region 106 can include a plurality of regions 106A and 106B of the second conductivity type stacked in the depth direction of the semiconductor substrate SS. The second semiconductor region 102 can include a plurality of regions 102A, 102B, 102C, 102D, and 102E of the second conductivity type stacked in the depth direction of the semiconductor substrate SS. The third semiconductor region 107 can include a plurality of regions 107A, 107B, 107C, 107D, and 107E of the second conductivity type stacked in the depth direction of the semiconductor substrate SS.

According to a structure in which at least one of the first semiconductor region 106, the second semiconductor region 102, and the third semiconductor region 107 is formed by the plurality of regions of the second conductivity type stacked in the depth direction of the semiconductor substrate SS, a potential gradient is controlled easily. This is advantageous in suppressing color mixture and blooming caused when charges move between a pixel PIX and the pixel PIX or increasing collection efficiency of the charges in the charge accumulation region 103.

The impurity concentration distribution of the charge accumulation region 103 in the depth direction of the semiconductor substrate SS has a peak at a depth Rp1. The impurity concentration distribution of the first semiconductor region 106 in the depth direction has one peak at a depth Rp2. The impurity concentration (that is, the peak value) of the first semiconductor region 106 at the depth Rp2 is C1. The impurity concentration distribution of the second semiconductor region 102 in the depth direction has one peak at a depth Rp3. The impurity concentration (that is, the peak value) of the second semiconductor region 102 at the depth Rp3 is C2.

Note that as exemplified in FIG. 10, it is preferable that Rp1<Rp2<Rp3 is satisfied and C1>C2 is satisfied. According to this arrangement, the first semiconductor region 106 forms a potential barrier so as to surround the boundary portion between the charge accumulation region 103 of the first conductivity type and the second semiconductor region 102 of the second conductivity type, that is, a region where a depletion layer 110 is formed. Such a structure is advantageous in reducing the flow of charges to be a cause of noise from the vicinity of an element isolation 104 (the interface between the element isolation 104 and the semiconductor regions 106, 112, and 105) into the charge accumulation region 103 or the depletion layer 110. Such a structure is also advantageous in forming a potential gradient formed by the charge accumulation region 103, the first semiconductor region 106, and the second semiconductor region 102 so as to increase collection efficiency of the charges by the charge accumulation region 103.

As an application of the photoelectric conversion apparatus 1 according to the above-described embodiments, a camera in which the photoelectric conversion apparatus 1 is assembled will exemplarily be described below. The concept of the camera includes not only an apparatus mainly aiming at shooting but also an apparatus (for example, a personal computer or a portable terminal) accessorily having a shooting function. The camera includes the photoelectric conversion apparatus according to the present invention exemplified as the above-described embodiments, and a processing unit which processes a signal output from the photoelectric conversion apparatus. The processing unit can include, for example, an A/D converter and a processor which processes digital data output from the A/D converter.

Other Embodiments

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-067463, filed Mar. 27, 2015, which is hereby incorporated by reference herein in its entirety.

What is claimed is:

1. A photoelectric conversion apparatus comprising:
a charge accumulation region of a first conductivity type, the charge accumulation region being arranged in a semiconductor substrate;
a first semiconductor region of a second conductivity type different from the first conductivity type, the first semiconductor region being arranged in the semiconductor substrate;
a second semiconductor region of the second conductivity type, the second semiconductor region being arranged in the semiconductor substrate; and
an element isolation made of an insulator, the element isolation being arranged on the semiconductor substrate,
wherein the first semiconductor region is arranged so as to extend downward from a portion between the charge accumulation region and the element isolation, and the second semiconductor region includes a portion arranged below the charge accumulation region, and
wherein an impurity concentration distribution of the charge accumulation region in a depth direction of the semiconductor substrate has a peak at a depth Rp1, an impurity concentration distribution of the first semiconductor region in the depth direction has a peak at a depth Rp2, an impurity concentration distribution of the second semiconductor region in the depth direction has a peak at a depth Rp3, and $Rp1<Rp2<Rp3$ is satisfied, and
wherein C1 is an impurity concentration of the first semiconductor region at the depth Rp2, C2 is an impurity concentration of the second semiconductor region at the depth Rp3, and $C1>C2$ is satisfied.

2. The apparatus according to claim 1, wherein a lower end of the first semiconductor region is in a position deeper than an upper end of the second semiconductor region and shallower than a lower end of the second semiconductor region.

3. The apparatus according to claim 1, wherein a third semiconductor region of the second conductivity type is further arranged in the semiconductor substrate, the third semiconductor region is arranged in a lateral direction of the second semiconductor region, and the first semiconductor region includes a portion arranged between the third semiconductor region and the portion of the second semiconductor region.

4. The apparatus according to claim 3, wherein a lower end of the third semiconductor region is in a position deeper than a lower end of the second semiconductor region.

5. The apparatus according to claim 3, wherein an impurity concentration distribution of the third semiconductor region in the depth direction has a peak at a depth Rp4, and $Rp1<Rp2<Rp3<Rp4$ is satisfied.

6. The apparatus according to claim 3, wherein a fourth semiconductor region of the second conductivity type and a fifth semiconductor region of the first conductivity type are further arranged in the semiconductor substrate,
wherein the fourth semiconductor region is arranged on the third semiconductor region, and
wherein the fifth semiconductor region is arranged on the fourth semiconductor region and forms a diffusion region of a transistor.

7. The apparatus according to claim 3, wherein an impurity concentration distribution of the third semiconductor region has a plurality of peaks in the depth direction.

8. The apparatus according to claim 1, wherein the impurity concentration distribution of the second semiconductor region has a plurality of peaks in the depth direction.

9. The apparatus according to claim 1, wherein an impurity concentration distribution of the first semiconductor region has a plurality of peaks in the depth direction.

10. A photoelectric conversion apparatus comprising:
a charge accumulation region of a first conductivity type, the charge accumulation region being arranged in a semiconductor substrate;
a first semiconductor region of a second conductivity type different from the first conductivity type, the first semiconductor region being arranged in the semiconductor substrate;
a second semiconductor region of the second conductivity type, the second semiconductor region being arranged in the semiconductor substrate;
a third semiconductor region of the second conductivity type, the third semiconductor region being arranged in the semiconductor substrate; and
an element isolation made of an insulator, the element isolation being arranged on the semiconductor substrate,
wherein the first semiconductor region is arranged so as to extend downward from a portion between the charge accumulation region and the element isolation,
wherein the second semiconductor region includes a portion arranged below the charge accumulation region,
wherein the third semiconductor region is arranged in a lateral direction of the second semiconductor region, and
wherein the first semiconductor region includes a portion arranged between the third semiconductor region and the portion of the second semiconductor region.

11. The apparatus according to claim 10, wherein a lower end of the third semiconductor region is in a position deeper than a lower end of the second semiconductor region.

12. The apparatus according to claim 10, wherein a lower end of the first semiconductor region is in a position deeper than an upper end of the second semiconductor region and shallower than a lower end of the second semiconductor region.

13. The apparatus according to claim 10, wherein the element isolation is an STI (Shallow Trench Isolation).

14. The apparatus according to claim 10, wherein a lower end of the third semiconductor region is in a position deeper than a lower end of the second semiconductor region.

15. The apparatus according to claim 10, wherein a fourth semiconductor region of the second conductivity type and a fifth semiconductor region of the first conductivity type are further arranged in the semiconductor substrate,
wherein the fourth semiconductor region is arranged on the third semiconductor region, and
wherein the fifth semiconductor region is arranged on the fourth semiconductor region and forms a diffusion region of a transistor.

16. The apparatus according to claim 10, wherein an impurity concentration distribution of the third semiconductor region has a plurality of peaks in a depth direction of the semiconductor substrate.

17. The apparatus according to claim 10, wherein an impurity concentration distribution of the second semiconductor region has a plurality of peaks in a depth direction of the semiconductor substrate.

18. The apparatus according to claim 10, wherein an impurity concentration distribution of the first semiconductor region has a plurality of peaks in a depth direction of the semiconductor substrate.

19. A camera comprising:
a photoelectric conversion apparatus; and
a processing unit configured to process a signal output from the photoelectric conversion apparatus,
wherein the photoelectric conversion apparatus comprises:
a charge accumulation region of a first conductivity type, the charge accumulation region being arranged in a semiconductor substrate,
a first semiconductor region of a second conductivity type different from the first conductivity type, the first semiconductor region being arranged in the semiconductor substrate,
a second semiconductor region of the second conductivity type, the second semiconductor region being arranged in the semiconductor substrate, and
an element isolation made of an insulator, the element isolation being arranged on the semiconductor substrate,
wherein the first semiconductor region is arranged so as to extend downward from a portion between the charge accumulation region and the element isolation, and the second semiconductor region includes a portion arranged below the charge accumulation region,
wherein an impurity concentration distribution of the charge accumulation region in a depth direction of the semiconductor substrate has a peak at a depth Rp1, an impurity concentration distribution of the first semiconductor region in the depth direction has a peak at a depth Rp2, an impurity concentration distribution of the second semiconductor region in the depth direction has a peak at a depth Rp3, and $Rp1<Rp2<Rp3$ is satisfied, and
wherein C1 is an impurity concentration of the first semiconductor region at the depth Rp2, C2 is an impurity concentration of the second semiconductor region at the depth Rp3, and $C1>C2$ is satisfied.

20. A camera comprising:
a photoelectric conversion apparatus; and
a processing unit configured to process a signal output from the photoelectric conversion apparatus,
wherein the photoelectric conversion apparatus comprises:
a charge accumulation region of a first conductivity type, the charge accumulation region being arranged in a semiconductor substrate,
a first semiconductor region of a second conductivity type different from the first conductivity type, the first semiconductor region being arranged in the semiconductor substrate,
a second semiconductor region of the second conductivity type, the second semiconductor region being arranged in the semiconductor substrate,
a third semiconductor region of the second conductivity type, the third semiconductor region being arranged in the semiconductor substrate, and
an element isolation made of an insulator, the element isolation being arranged on the semiconductor substrate,
wherein the first semiconductor region is arranged so as to extend downward from a portion between the charge accumulation region and the element isolation,
wherein the second semiconductor region includes a portion arranged below the charge accumulation region,
wherein the third semiconductor region is arranged in a lateral direction of the second semiconductor region, and
wherein the first semiconductor region includes a portion arranged between the third semiconductor region and the portion of the second semiconductor region.

* * * * *